US011290073B1

(12) United States Patent
Lim et al.

(10) Patent No.: US 11,290,073 B1
(45) Date of Patent: Mar. 29, 2022

(54) SELF-BIASED DIFFERENTIAL TRANSMITTER

(71) Applicant: Synaptics Incorporated, San Jose, CA (US)

(72) Inventors: Shao-Jen Lim, San Jose, CA (US); Shriram Kulkarni, San Jose, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 17/100,140

(22) Filed: Nov. 20, 2020

(51) Int. Cl.
*H03F 3/45* (2006.01)
*H03K 17/687* (2006.01)
*G11C 7/06* (2006.01)

(52) U.S. Cl.
CPC ......... *H03F 3/45179* (2013.01); *G11C 7/062* (2013.01); *H03K 17/6871* (2013.01)

(58) Field of Classification Search
CPC ............. H03F 3/45179; H03F 3/45188; H03F 3/45192; H03F 3/45201; H03F 3/45206; H03K 17/6871; H03K 5/2481; G11C 7/062; G01R 19/0038
See application file for complete search history.

(56) References Cited

FOREIGN PATENT DOCUMENTS

WO    WO-2009131215 A1 * 10/2009 ....... H03K 19/01855

\* cited by examiner

*Primary Examiner* — Jung Kim
(74) *Attorney, Agent, or Firm* — Paradice & Li LLP

(57) ABSTRACT

A self-biased differential transmitter is provided. The transmitter may include a differential output driver powered by a supply voltage provided by a differential signal receiver. The output driver may include a bias voltage generator to generate bias voltages to enable one or more transistors in the output driver to operate with differential signals that are beyond the safe operating voltage range of transistors included within the differential transmitter.

12 Claims, 5 Drawing Sheets

SELF-BIASED DIFFERENTIAL TRANSMITTER

TECHNICAL FIELD

This disclosure relates generally to differential transmitters, and more specifically to self-biased differential transmitters.

BACKGROUND OF RELATED ART

Differential signals are often used to transmit and receive data between electronic devices because they are noise tolerant and can support high signaling speeds, for example, of 1 GHz and above. Some differential signals may conform to industry specifications or standards. For example, the High-Definition Media Interface (HDMI) specification, set forth by the Consumer Electronics Association/Electronics Industries Alliance (CEA/EIA) 861 standard, defines differential signaling rates, voltage levels, number of differential channels, and differential impedance, among other examples. Thus, differential signals used in certain multimedia applications may be transmitted at voltage levels set forth by the HDMI specifications or standards.

Electronic devices may use integrated circuits to implement interfaces to transmit and receive differential signals, such as HDMI signals. The differential signals may have voltage levels that require the integrated circuits to use special voltage-tolerant transistors that may be different than other transistors used throughout the integrated circuit. These voltage-tolerant transistors may add cost and complexity to the integrated circuit. In some cases, special voltage tolerant transistors may not be feasible within the device technology used to fabricate other transistors within the integrated circuit. Thus, it may be desirable to implement differential signal interfaces, including differential signal transmitter interfaces, without special voltage-tolerant transistors.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A differential output driver is disclosed. The output driver may include a pair of first transistors, and a plurality of transistors. The pair of first transistors may be configured to receive a differential input signal, each of the first transistors having a first safe operating voltage. The plurality of transistors may be coupled between the pair of first transistors and output terminals of the differential output driver, the plurality of transistors being configured to receive a supply voltage via the output terminals and reduce a voltage level of the supply voltage for the pair of first transistors, wherein the supply voltage is greater than the first safe operating voltage.

A bias voltage generator is disclosed. The bias voltage generator may include a first transistor, a second transistor, and an operational amplifier. The first transistor may be configured to receive a first common-mode voltage and output a drain current based on the first common-mode voltage. The second transistor may be configured to receive the drain current from the first transistor and output a second common-mode voltage based on the drain current. The operational amplifier may include an inverting input to receive the second common-mode voltage, a non-inverting input to receive a reference voltage, and an output to provide a bulk voltage for substrates of the first and the second transistors, wherein the bulk voltage controls the second common-mode voltage through the first and second transistors based at least in part on the reference voltage.

BRIEF DESCRIPTION OF THE DRAWINGS

The present embodiments are illustrated by way of example and are not intended to be limited by the figures of the accompanying drawings.

DETAILED DESCRIPTION

Figure 1:
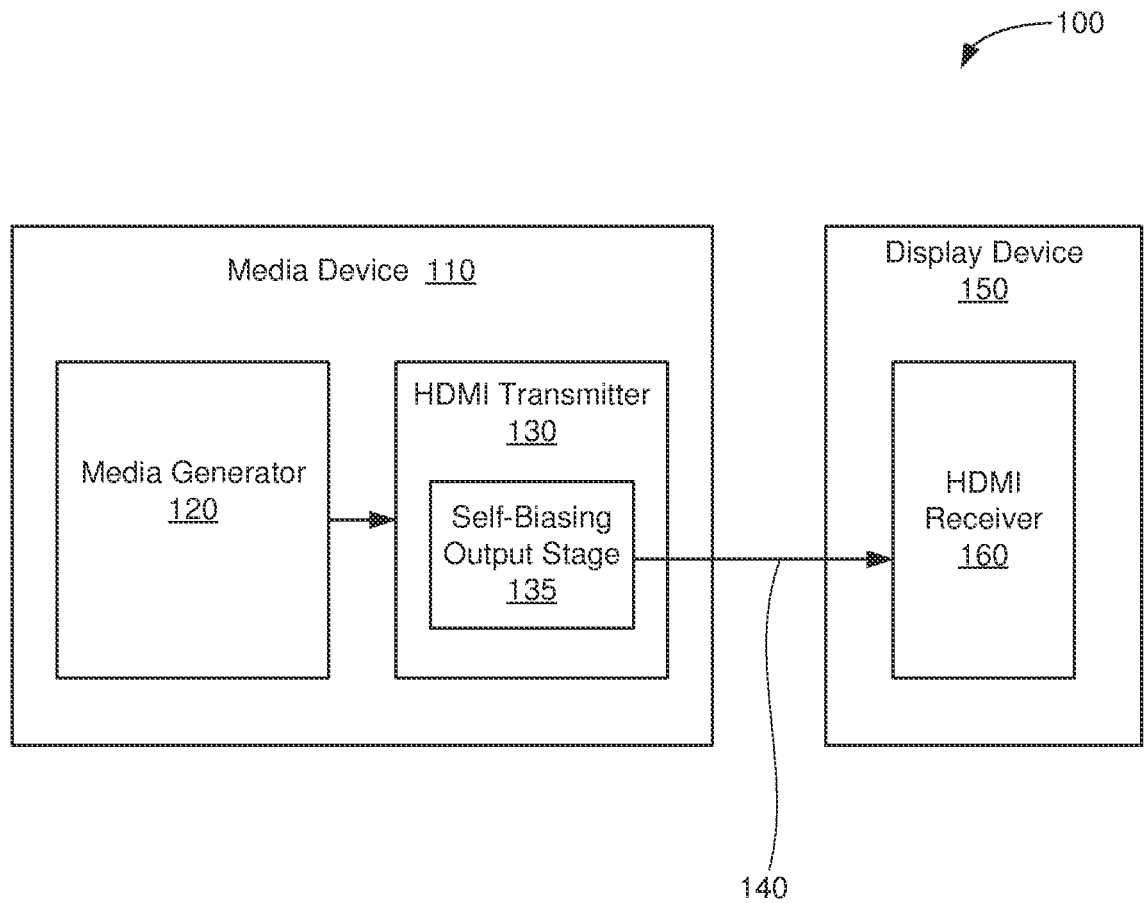
FIG. 1 shows an example media system in accordance with some implementations.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example implementations. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present disclosure, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

Various implementations relate generally to differential signaling. Some implementations more specifically relate to differential signal transmitters included in integrated circuits. In one implementation, a differential signal transmitter may include a plurality of transistors that receive one or more bias voltages that enable the plurality of transistors to withstand voltages that would otherwise damage the transistors. The differential signal transmitter may receive supply power from a differential signal receiver. In another implementation, a differential signal transmitter may include a bias voltage generator that receives supply power from the differential signal receiver and generates the bias voltages for the plurality of transistors of the differential signal transmitter.

Particular implementations of the subject matter described in this disclosure can be implemented to realize one or more of the following potential advantages. In some implementations, the described techniques can be used to enable transistors to operate with differential signals having voltage levels that may damage the transistors, thereby reducing or eliminating the need for special voltage-tolerant devices to be used in a differential signal interface and reducing cost and complexity of the associated integrated circuits.

FIG. 1 shows an example media system 100 in accordance with some implementations. The media system 100 may include a media device 110 coupled to a display device 150 via a High Definition Multimedia Interface (HDMI) link 140. The HDMI link 140 provides a communication medium for transmitting and receiving differential signals between the media device 110 and the display device 150. In some other implementations, the media device 110 may be coupled to the display device 150 via any other feasible differential signal link. The media device 110 may generate multimedia data for display by the display device 150.

The media device 110 may include a media generator 120 and an HDMI transmitter 130. The media generator 120 may retrieve, render, generate and/or create media data such as image data and/or audio data. The media generator 120 provides the multimedia data to the HDMI transmitter 130 to be encoded and transmitted over the HDMI link 140, as differential signals, to the display device 150. The HDMI transmitter 130 may include a self-biasing output stage 135. The self-biasing output stage 135 may include circuitry for driving the differential signals on the HDMI link 140.

The display device 150 may include an HDMI receiver 160 to receive the differential signals over the HDMI link 140. In some implementations, the HDMI receiver 160 may provide power to the self-biasing output stage 135 of the HDMI transmitter 130. That is, some or all of the power for the self-biasing output stage 135 may be supplied by the HDMI receiver 160. In one implementation, voltage levels and termination resistance values associated with the HDMI link 140 may be specified by a standard such as, for example, the HDMI specification set forth by the Consumer Electronics Association/Electronics Industries Alliance (CEA/EIA) 861 standard.

Figure 2:
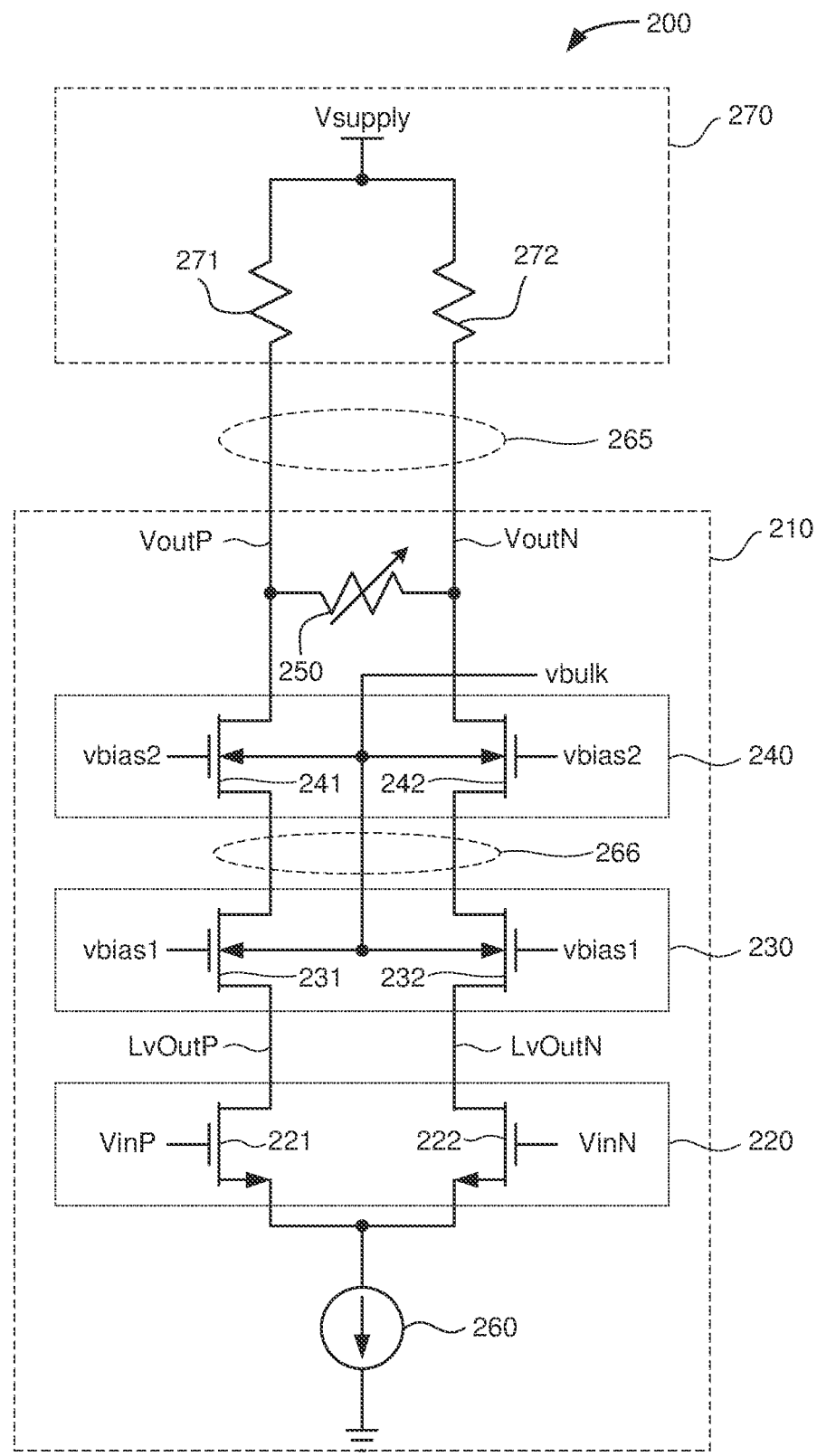
FIG. 2 shows a simplified schematic diagram of an example HDMI system.

FIG. 2 shows a simplified schematic diagram of an example HDMI system 200. The HDMI system 200 may include a differential output driver 210, an HDMI link 265, and a receiver 270. With reference for example to FIG. 1, the differential output driver 210 may form at least part of the self-biasing output stage 135, the HDMI link 265 may be one example of the HDMI link 140, and the receiver 270 may be one example of the HDMI receiver 160.

The receiver 270 may be a differential signal receiver including resistors 271 and 272. The resistors 271 and 272 may be coupled between a voltage Vsupply and the HDMI link 265. In some implementations, the resistors 271 and 272 may be termination resistors whose values are determined, at least in part, by a standard, such as HDMI. In some aspects, the voltage level of Vsupply may also be defined by a standard (such as HDMI). Although not shown for simplicity, the receiver 270 may include additional circuitry to process the data received via the HDMI link 265.

The differential output driver 210 may include a first transistor pair 220, a second transistor pair 230, a third transistor pair 240, a variable resistor 250, and a current source 260. The differential output driver 210 may receive a differential input signal (represented as component signals VinP and VinN) and generate a differential output signal (represented as component signals VoutP and VoutN). The differential output signal VoutP/VoutN may be driven through the HDMI link 265. The variable resistor 250 may be a variable termination resistor having a value determined by a standard.

The first transistor pair 220 includes transistors 221 and 222. The gates of transistors 221 and 222 are configured to receive the component signals VinP and VinN, respectively. The sources of transistors 221 and 222 may be coupled together and further coupled to the current source 260. The first transistor pair 220 may output a first intermediate differential signal (represented as component signals LvOutP and LvOutN) based on the differential input signal VinP/VinN. In one implementation, transistors 221 and 222 are operated in a saturation mode to generate the first intermediate differential signal LvOutP/LvOutN. Operation in the saturation mode may reduce signaling errors of the differential output driver 210.

The second transistor pair 230 includes transistors 231 and 232, which are coupled to the first transistor pair 220. For example, the sources of transistors 231 and 232 may be coupled to the drains of transistors 221 and 222, respectively. The second transistor pair 230 may generate a second intermediate differential signal 266 based on the first intermediate differential signal LvOutP/LvOutN. The third transistor pair 240 includes transistors 241 and 242, which are coupled to the second transistor pair 230. For example, the sources of transistors 241 and 242 may be coupled to the drains of transistors 231 and 232, respectively. The variable resistor 250 is coupled between the drains of the transistors 241 and 242. The third transistor pair 240 may generate the signals VoutP and VoutN via the drains of transistors 241 and 242, respectively, based on the second intermediate differential signal 266. In some implementations, the second transistor pair 230 and the third transistor pair 240 may "level-shift" the LvOutP and LvOutN signals output by the first transistor pair 220 to produce the VoutP and VoutN signals, respectively.

In the example of FIG. 2, each of the transistors 221, 222, 231, 232, 241, and 242 is depicted as an N-channel Metal Oxide Silicon Field Effect Transistor (MOSFET). However, in other implementations, some or all of the transistors 221, 222, 231, 232, 241, and 242 may be P-channel MOSFETs. In some other implementations, the transistors 221, 222, 231, 232, 241, and 242 may include any feasible three terminal and/or four terminal semiconductor device such as bi-polar transistors, junction gate field effect transistors (JFETs), fin field effect transistors (FinFETs), or the like. Further, transistors 221 and 222 may have a first safe operating voltage range whereas transistors 231, 232, 241, and 242 may have a second safe operating voltage range different than the first safe operating voltage range. In some implementations, the safe operating voltage range may describe a maximum voltage difference that may be sustained across two of the transistor terminals (typically between the source and drain) before transistor reliability is negatively affected and/or damage is sustained. The safe operating voltage range of a transistor may be determined by transistor dimensions, doping levels, and/or other transistor parameters. In some implementations, the second safe operating voltage range may be twice the voltage range as the first safe operating voltage range. Further, the first safe operating voltage range and the second safe operating voltage range may each be less than Vsupply. For example, Vsupply may be twice as large as the second safe operating voltage range and four times as large as the first safe operating voltage range.

As discussed with reference to FIG. 1, the receiver 270 may provide some or all of the supply power for the differential output driver 210. For example, Vsupply may be provided, across the resistors 271 and 272, to the differential output driver 210. Vsupply may be greater than the first or second safe operating voltage ranges and may damage the respective transistors. In some implementations, the first transistor pair 220, the second transistor pair 230 and the third transistor pair 240 may be serially coupled together (as depicted in FIG. 2) and biased to ensure that the transistors of the differential output driver 210 are not damaged by Vsupply. For example, the serial arrangement of the first, second, and third transistor pairs 220, 230, and 240 reduces the voltage that appears across individual transistors of the differential output driver 210. Furthermore, bias voltages provided to the second and third transistor pairs 230 and 240 may limit current through the first, second, and third transistor pairs 220, 230, and 240 thereby preventing current damage to the transistors of the differential output driver 210. Such arrangement and operation of the first, second, and third transistor pairs 220, 230, and 240 may reduce or eliminate the need for special voltage-tolerant transistors in the differential output driver 210 (or a single conventional special full voltage tolerant transistor connected to the drains of output driver 210), thereby reducing complexity and/or cost of the associated integrated circuit. In one implementation, a bias voltage generator (not shown for simplicity) may provide a first bias voltage Vbias1, a second bias voltage Vbias2, and a substrate voltage Vbulk for the second transistor pair 230 and the third transistor pair 240. Vbias1 is provided to the gates of transistors 231 and 232, Vbias2 is provided to the gates of transistors 241 and 242, and Vbulk is provided to the substrates of transistors 231, 232, 241, and 242.

Figure 3:
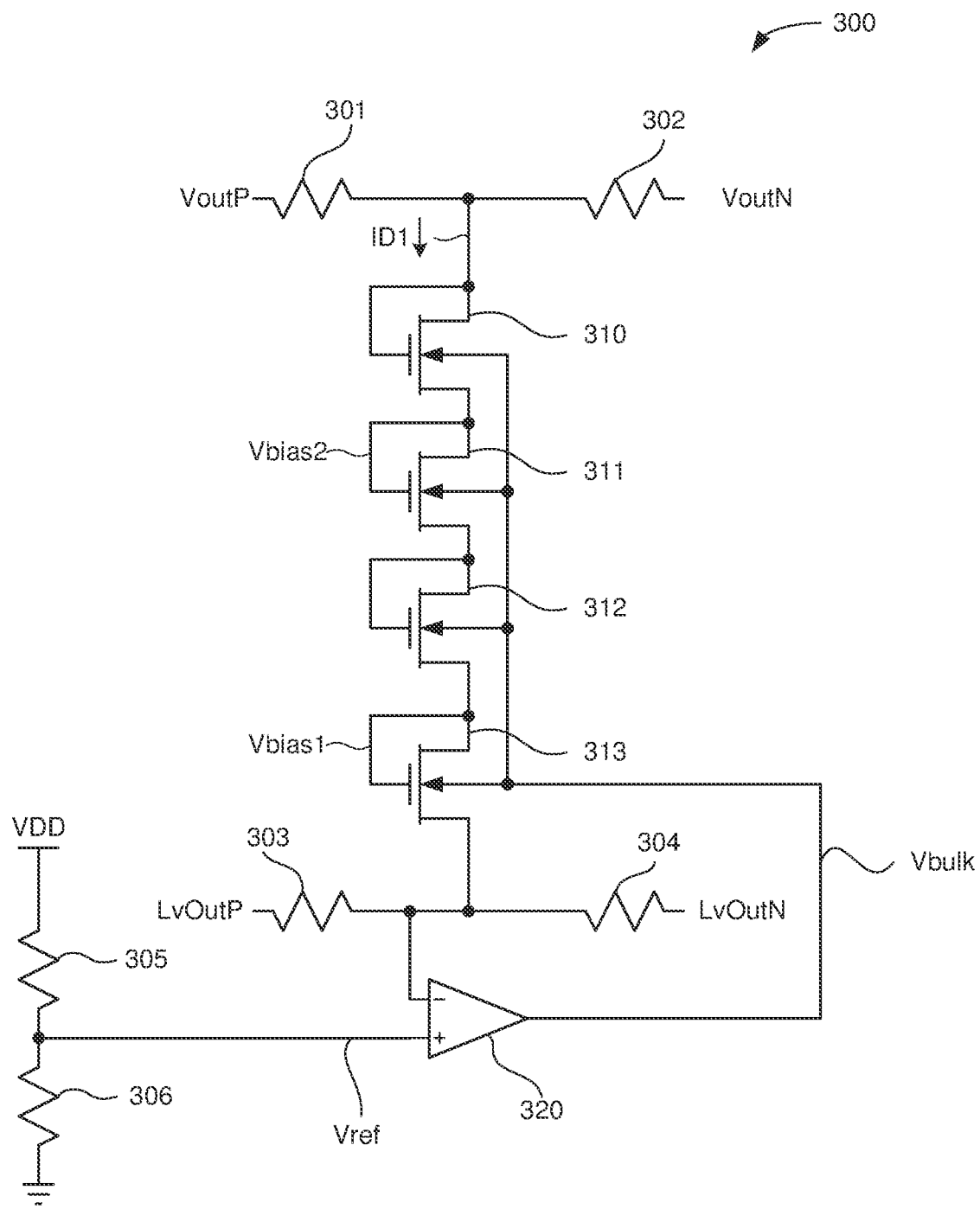
FIG. 3 shows a simplified schematic diagram of a bias voltage generator.

FIG. 3 shows a simplified schematic diagram of a bias voltage generator 300. The bias voltage generator 300 may include resistors 301-306, transistors 310-313 and an operational amplifier 320. In some implementations, the bias voltage generator 300 may form at least part of the self-biasing output stage 135 of FIG. 1. In the example of FIG. 3, the transistors 310-313 are depicted as N-channel transistors. However, in other implementations some or all of the transistors 310-313 may be P-channel transistors. In some implementations, each of the transistors 310-313 may have the same safe operating voltage range as each of the transistors of the second transistor pair 230 and third transistor pair 240.

A first terminal of the resistor 301 is coupled to receive VoutP and a second terminal of the resistor 301 is coupled to the drain of transistor 310. With reference for example to FIG. 2, the first terminal of the resistor 301 may be coupled to the drain of transistor 241. Similarly, a first terminal of the resistor 302 is coupled to receive VoutN and a second terminal of the resistor 302 is coupled to the drain of transistor 310. For example, the first terminal of the resistor 302 may be coupled to the drain of transistor 242. Transistor 310 provides a drain current ID1 based, at least in part, on the common-mode voltage of VoutP and VoutN. In some implementations, the output voltages VoutP and VoutN are provided, at least in part, by the receiver 270 of FIG. 2. Accordingly, the receiver 270 also may provide some or all of the power for the bias voltage generator 300 through the resistors 301 and 302.

In the example of FIG. 3, each of the transistors 310-313 are diode-connected, meaning that the gate and drain of each transistor is coupled together. For example, the gate of transistor 310 is connected to the drain of transistor 310, and the gates and drains of each of the remaining transistors 311-313 is connected in a similar manner. The transistors 310-313 are further coupled to one another in series. Specifically, the source of transistor 310 is coupled to the drain of transistor 311, the source of transistor 311 is coupled to the drain of transistor 312, and the source of transistor 312 is coupled to the drain of transistor 313.

A first terminal of resistor 303 is coupled to receive LvOutP and a second terminal of resistor 303 is coupled to the source of transistor 313 and the inverting input of the operational amplifier 320. With reference to FIG. 2, the first terminal of resistor 303 may be coupled to the drain of transistor 221. Similarly, a first terminal of resistor 304 is coupled to LvOutN and a second terminal of resistor 304 is coupled to the inverting input of the operational amplifier 320. For example, the first terminal of resistor 304 may be coupled to the drain of transistor 222. Thus, a common-mode voltage of LvOutP and LvOutN is coupled to the inverting input of the operational amplifier 320. In some implementations, values for the resistors 301-304 may be determined, at least in part, by current limitations for the differential output driver 210 that may be related to a standard. For example, the values of the resistors 301-304 may be selected to ensure that the bias voltage generator 300 (which may be part of the differential output driver 210) consumes less than a maximum current specified by a standard, such as the HDMI standard. The resistors 305 and 306 form a voltage divider to provide a reference voltage Vref to the non-inverting input of the operational amplifier 320. Thus, values for resistors 305 and 306 may be selected based, at least in part, on a target reference voltage Vref. Further, larger resistance values for resistors 305 and 306 may reduce the current dissipated by the bias voltage generator 300. The operational amplifier 320 outputs a voltage Vbulk that is provided to the substrates of transistors 310-313 and may be used to bias, at least in part transistors 310-313.

In operation, the operational amplifier 320 attempts to drive the voltage at its inverting input to the same voltage as Vref (sensed at its non-inverting input) by adjusting the voltage Vbulk provided to the transistors 310-313. In some implementations, the operational amplifier 320 may adjust Vbulk to control the drain current ID1 through the transistors 310-313. For example, the Vbulk provided by the operational amplifier 320 may be a non-zero voltage to control drain current ID1. In contrast, conventional implementations may couple the substrates of transistors 310-313 to ground or zero volts. Changing the drain current ID1 also may change the voltage at the source of transistor 313 and the inverting input of the operational amplifier 320.

As described above, the operational amplifier 320 attempts to drive the voltage at its inverting input to the same voltage as Vref. This may cause the common-mode voltage of LvOutP and LvOutN (provided by transistors 231 and 232) to be approximately equal to Vref. With reference for example to FIG. 2, the reference voltage Vref may be configured to maintain the voltages at the drains of transistors 221 and 222 (coupled to transistors 231 and 232) at respective levels to ensure that these transistors operate in the saturation mode. Operating transistors 221 and 222 in the saturation mode may reduce signaling errors of the differential output driver 210.

The voltage at the drain of transistor 310 may be determined by VoutP and VoutN (which is dependent on Vsupply) and the voltage of the source of transistor 313 may be determined by Vref. Since Vsupply and Vref may be predetermined, the voltages across the transistors 310-313 also may be known. Given a known voltage difference Vsupply−Vref across transistors 310-313, the bias voltage generator 300 may be configured to generate bias voltages (Vbias1, Vbias2, and Vbulk) to operate transistors 221, 222, 231, 232, 241, 242, and 310-313 in their respective safe operating voltage ranges. In some implementations, the voltage difference Vsupply−Vref may be greater than the first and second safe operating voltages.

The first bias voltage Vbias1 is provided by the source of transistor 312 and the second bias voltage Vbias2 is provided by the source of transistor 310. In some implementations, the transistors 310-313 may have similar operating characteristics. As a result, because each transistor 310-313 carries the same current ID1, each transistor will have a similar drain-to-source voltage ($V_{DS}$). Thus, Vbias1 is approximately equal to Vref+$V_{DS}$ and Vbias2 is approximately equal to Vref+3$V_{DS}$. Therefore, Vbias2 is greater than Vbias1.

Figure 4:
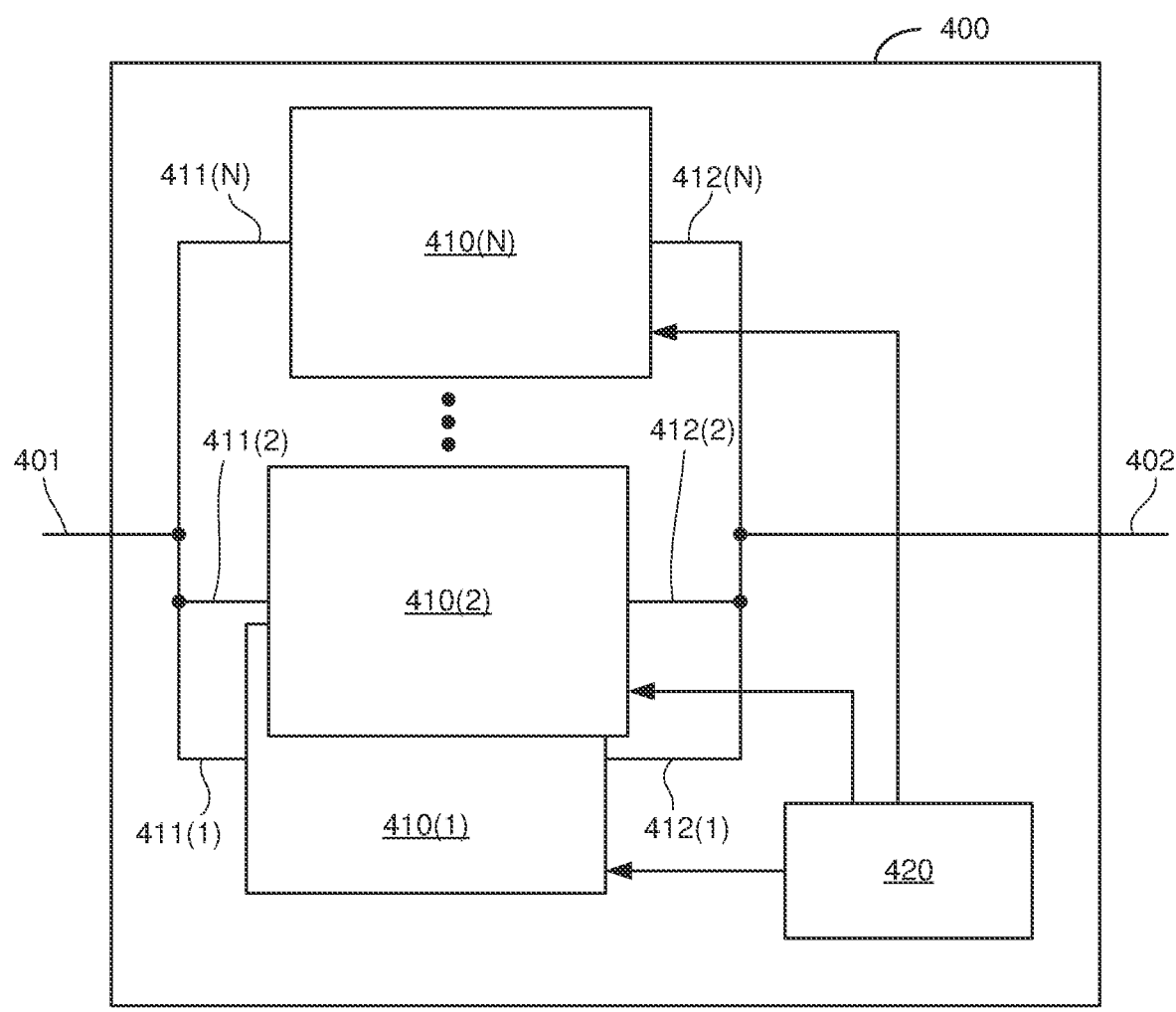
FIG. 4 is a block diagram of a variable resistor.

FIG. 4 is a block diagram of a variable resistor 400. In some implementations, the variable resistor 400 may be one example of the variable resistor 250 of FIG. 2. Thus, terminal 401 of the variable resistor 400 may be coupled to the drain of transistor 241 and terminal 402 of the variable resistor 400 may be coupled to the drain of transistor 242. In some implementations, the variable resistor 400 may be a termination resistor of, for example, the HDMI link 265. Thus, values of the variable resistor 400 may be based on impedance characteristics associated with the differential output driver 210 or the HDMI link 265. For example, if the differential output driver 210 is coupled to a link having a 100 ohm differential impedance, then the variable resistor 400 may be configured such that the differential output driver 210 presents a 100 ohm differential impedance to the HDMI link 265.

The variable resistor 400 includes a number (N) of switchable resistors 410(1)-410(N) and a controller 420. Each switchable resistor 410(1)-410(N) can be coupled between terminal 401 and terminal 402 of the variable resistor 400. For example, a first terminal 411(1) of the switchable resistor 410(1) may be coupled to terminal 401 and a second terminal 412(1) of the switchable resistor 410(1) may be coupled to terminal 402. Each switchable resistor 410(1)-410(N) may have a different resistor value and be controlled (e.g., enabled) by the controller 420. When a switchable resistor (such as one of 410(1)-410(N)) is enabled, the resistance value associated with the enabled switchable resistor is coupled between terminals 401 and 402. Conversely, when a switchable resistor is not enabled, then the resistance value associated with the unenabled switchable resistor is not coupled between terminals 401 and 402.

Figure 5:
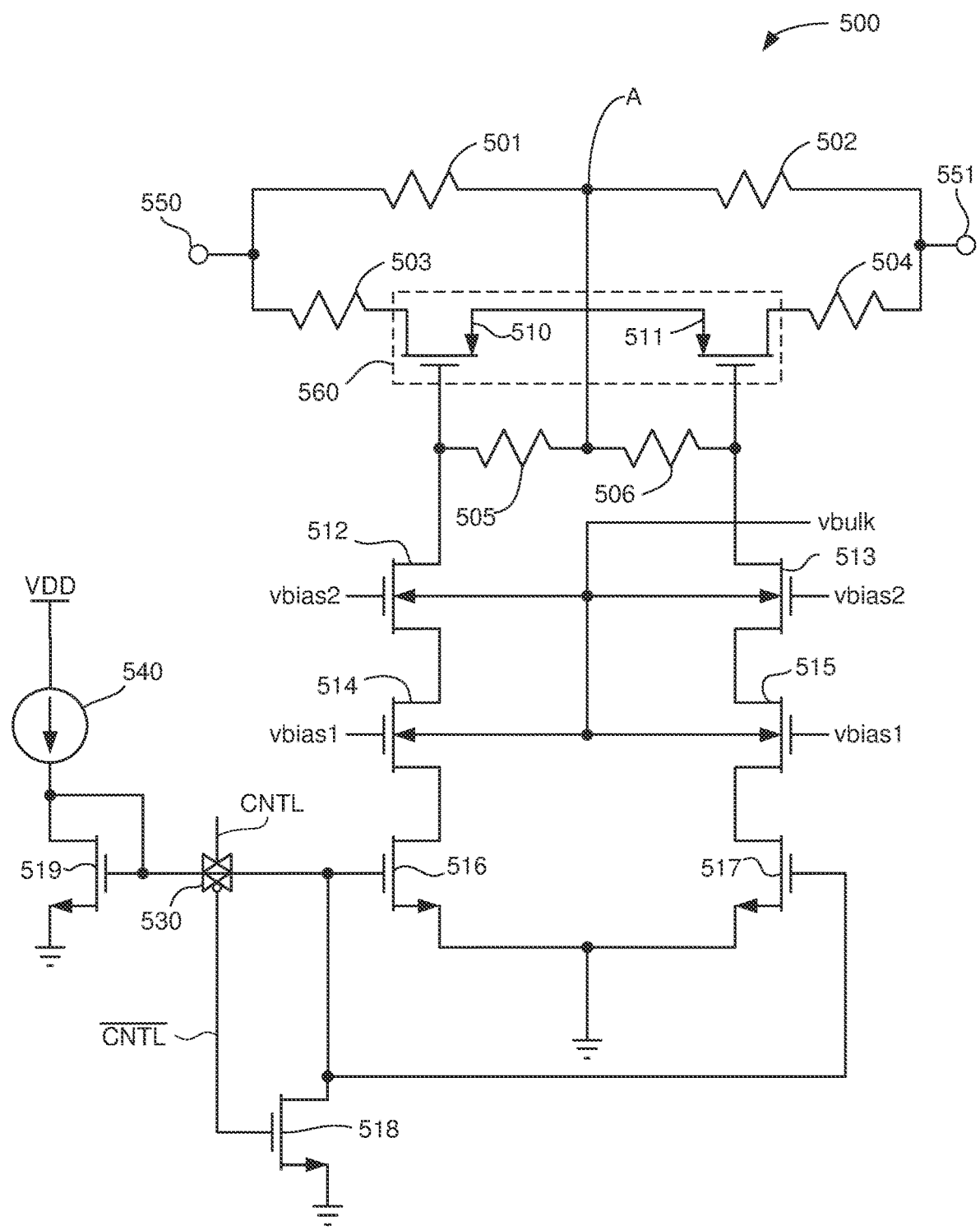
FIG. 5 is a simplified schematic diagram of a switchable resistor.

FIG. 5 is a simplified schematic diagram of a switchable resistor 500. In some implementations, the switchable resistor 500 may be one example of any of the switchable resistors 410(1)-410(N) of FIG. 4. The switchable resistor 500 may include resistors 501-506, transistors 510-519, a pass transistor 530, a current source 540. Each of the transistors 510, 511 and 516-519 may be similar (for example, with respect to safe operating voltage ranges) to the transistors 221 and 222 of FIG. 2. Each of the transistors 512-515 may be similar (for example, with respect to safe operating voltage ranges) to the transistors 231, 232, 241, and 242 of FIG. 2. In some aspects, transistors 510, 511 and 516-519 may have a first safe operating voltage range and the transistors 512-515 may have a second safe operating voltage range. With reference for example to FIG. 2, terminals 550 and 551 of the switchable resistor 500 may be coupled to the drains of transistor 241 and transistor 242, respectively. For example, terminal 550 may correspond to any of the terminals 411(1)-411(N) and terminal 551 may correspond to any of the terminals 412(1)-412(N).

Resistor 503 is coupled between terminal 550 and the drain of transistor 510. Similarly, resistor 504 is coupled between terminal 551 and the drain of transistor 511. The resistors 503 and 504 may function as termination resistors that may be switchably enabled by a fourth transistor pair 560 including transistors 510 and 511. For example, if transistors 510 and 511 are enabled (e.g., in a conducting state), then the resistors 503 and 504 are coupled together and operate as a termination resistor between terminals 550 and 551. On the other hand, if transistors 510 and 511 are not enabled, then the resistors 503 and 504 are effectively decoupled from each other by the high impedance of the transistors 510 and 511 and therefore no termination resistor is enabled between terminals 550 and 551.

The remaining components of the switchable resistor 500 may be used to control the operation of the transistors 510 and 511. For example, resistor 501 may be coupled between terminal 550 and node A, and resistor 502 may be coupled between node A and terminal 551. In this manner, node A may see a common-mode voltage of VoutP and VoutN provided by the drains of transistors 241 and 242, respectively. Values for resistors 501 and 502 may be selected to ensure that the switchable resistor 500 (which may be part of the differential output driver 210) consumes less than a maximum current specified by a standard. Resistor 505 may be coupled between node A and the gate of transistor 510 (as well as the drain of transistor 512). Resistor 506 may be coupled between node A and the gate of transistor 511 (as well as the drain of transistor 513). Values for resistors 505 and 506 may be selected to ensure that the transistors 510 and 511 may be reliably controlled. The voltage of node A may power, at least in part, transistors 512-517 through the drains of transistors 512 and 513.

The source of transistor 512 is coupled to the drain of transistor 514 and the source of transistor 514 is coupled to the drain of transistor 516. Similarly, the source of transistor 513 is coupled to the drain of transistor 515 and the source of transistor 515 is coupled to the drain of transistor 517. The gates of transistors 512 and 513 are configured to receive Vbias2 and the gates of transistors 514 and 515 are configured to receive Vbias1. The substrates of transistors 512-515 are configured to receive Vbulk. Vbias1, Vbias2 and Vbulk may bias, at least in part, the transistors 512-515. Vbias1, Vbias2, and Vbulk may be provided by the bias voltage generator 300 (not shown for simplicity).

The switchable resistor 500 is shown as a differential switchable resistor with respect to terminals 550 and 551. Persons skilled in the art will recognize that the resistors 501-506 and the transistors 510-517 form a differential circuit that is symmetric about node A and the voltage Vbulk. Thus, the node A and the voltage Vbulk may operate as virtual ground reference points enabling independent operation of a first group of devices (e.g., resistors 501, 503, and 505 and transistors 510, 512, 514, and 516) with respect to a second group of devices (e.g., resistors 502, 504, and 506 and transistors 511, 513, 515, and 517). In some implementations, a single-ended switchable resistor may be implemented with either the first or second group of devices.

A current source 540 is coupled to the drain and the gate of transistor 519 which, in turn, is coupled to the pass transistor 530. The pass transistor 530 is controlled by CNTL and $\overline{\text{CNTL}}$ signals. The $\overline{\text{CNTL}}$ signal is also coupled to the gate of transistor 518. To disable the switchable resistor 500, $\overline{\text{CNTL}}$ is driven high and CNTL is driven low to turn off the pass transistor 530 and cause the transistor 518 to pull the gates of transistors 516 and 517 to a low voltage. When the gates of transistors 516 and 517 are low, the transistors 516 and 517 are turned off, which in turn prevents current from flowing through transistors 512-515. As a result, transistors 510 and 511 are turned off, decoupling resistors 503 and 504.

On the other hand, if CNTL is high and $\overline{\text{CNTL}}$ is low, then transistor 518 is turned off and the pass transistor 530 is enabled, allowing voltage and/or current from the current source 540 to bias the gates of transistors 516 and 517. The voltage and/or current from the current source 540 enables transistors 516 and 517 to draw current through transistors 512-515 and turn on transistors 510 and 511, thereby coupling resistor 503 to resistor 504. As a result, a termination resistor, formed by resistors 503 and 504, is coupled to terminals 550 and 551.

Transistors 512-515 are arranged, with respect to Vsupply and ground, similar to transistors 231, 232, 241, and 242 and transistors 516 and 517 are arranged similar to transistors 221 and 222. Because of this, the bias voltages Vbias1 and Vbias2 and the substrate voltage Vbulk may be "reused" to bias transistors 512-515. Thus, similar to transistors 231, 232, 241, and 242, the transistors 512-515 may be protected from being exposed to voltages beyond their respective safe operating voltage ranges.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A differential output driver comprising:
    a pair of first transistors configured to receive a differential input signal, each of the first transistors having a first safe operating voltage range;
    a pair of output terminals;
    a variable termination resistor coupled between the output terminals; and
    a plurality of transistors coupled between the pair of first transistors and output terminals of the differential output driver, the plurality of transistors being configured to receive a supply voltage via the output terminals and reduce a voltage level of the supply voltage for the pair of first transistors, wherein the supply voltage is greater than the first safe operating voltage range;
    wherein the plurality of transistors include a pair of second transistors configured to receive a first intermediate differential output signal from the pair of first transistors and generate a second intermediate differential output signal, each of the second transistors having a second safe operating voltage range different from the first safe operating voltage range; and
    wherein the plurality of transistors includes a pair of third transistors configured to receive the second intermediate differential output signal and generate a differential output signal provided to the output terminals.

2. The differential output driver of claim 1, wherein the pair of first transistors sustain damage when operated with a voltage that exceeds the first safe operating voltage range.

3. The differential output driver of claim 1, wherein the second safe operating voltage range is twice the first safe operating voltage range.

4. The differential output driver of claim 1, wherein the supply voltage is greater than the first and second safe operating voltage ranges.

5. The differential output driver of claim 1, wherein the pair of third transistors is configured to receive the supply voltage from a differential signal receiver.

6. The differential output driver of claim 1, further comprising a bias voltage generator configured to provide a first bias voltage to the pair of second transistors and a second bias voltage to the pair of third transistors, wherein the second bias voltage is greater than the first bias voltage.

7. The differential output driver of claim 6, wherein the bias voltage generator is configured to provide a non-zero voltage to substrates of the second and third pairs of transistors.

8. The differential output driver of claim 1, wherein the differential output signal is provided by drains of the third pair of transistors.

9. The differential output driver of claim 1, wherein the variable termination resistor comprises:
    a first resistor including a first terminal coupled to a first drain of the third pair of transistors and a second terminal coupled to a fourth pair of transistors; and
    a second resistor including a first terminal coupled to a second drain of the third pair of transistors and a second terminal coupled to the fourth pair of transistors, wherein the fourth pair of transistors has the first safe operating voltage range of the pair of first transistors.

10. The differential output driver of claim 9, further comprising
    a fifth transistor including a source coupled to ground and having the first safe operating voltage range of the pair of first transistors;
    a sixth transistor including:
        a source coupled to a drain of the fifth transistor; and
        a drain coupled to a gate of a fifth transistor of the fourth pair of transistors.

11. The differential output driver of claim 10, wherein the sixth transistor has the second safe operating voltage range of the pair of second transistors.

12. The differential output driver of claim 10, wherein a substrate of the sixth transistor is coupled to a non-zero voltage.

* * * * *